US009519014B2

(12) United States Patent
Aaserude et al.

(10) Patent No.: US 9,519,014 B2
(45) Date of Patent: Dec. 13, 2016

(54) SYSTEMS AND METHODS FOR CALCULATING POWER TRANSMISSION LINE CAPACITY

(71) Applicant: Dynamic Engineers, Inc., Centerville, UT (US)

(72) Inventors: Robert Aaserude, Walnut Creek, CA (US); Ryan Bliss, Salt Lake City, UT (US)

(73) Assignee: Dynamic Engineers, Inc., Centerville, UT (US)

( * ) Notice: Subject to any disclaimer, the term of this patent is extended or adjusted under 35 U.S.C. 154(b) by 478 days.

(21) Appl. No.: 14/099,351

(22) Filed: Dec. 6, 2013

(65) Prior Publication Data

US 2014/0180616 A1  Jun. 26, 2014

Related U.S. Application Data

(60) Provisional application No. 61/734,191, filed on Dec. 6, 2012.

(51) Int. Cl.
*G01R 27/02* (2006.01)
*H02J 3/00* (2006.01)

(52) U.S. Cl.
CPC ............... *G01R 27/02* (2013.01); *H02J 3/00* (2013.01); *H02J 2003/007* (2013.01); *Y02E 60/76* (2013.01); *Y04S 40/22* (2013.01)

(58) Field of Classification Search
CPC ..................................................... G01R 27/02
USPC .......................................................... 702/65
See application file for complete search history.

(56) References Cited

U.S. PATENT DOCUMENTS

| 4,193,074 | A | 3/1980 | Schwartz et al. |
| 4,268,818 | A | 5/1981 | Davis et al. |
| 4,420,752 | A | 12/1983 | Davis et al. |
| 4,553,092 | A | 11/1985 | Purves |
| 4,584,523 | A | 4/1986 | Elabd |
| 4,709,339 | A | 11/1987 | Fernandes |
| 4,728,887 | A | 3/1988 | Davis |
| 4,758,962 | A | 7/1988 | Fernandes |
| 4,806,855 | A | 2/1989 | Davis |
| 5,140,257 | A | 8/1992 | Davis |

(Continued)

OTHER PUBLICATIONS

Bliss, Ryan and Philip Spillane, "Dynamic Line Ratings It's all About Understanding Conductor Behavior" May 2013.

(Continued)

*Primary Examiner* — Bryan Bui
(74) *Attorney, Agent, or Firm* — Santangelo Law Offices, P.C.

(57) ABSTRACT

The present disclosure provides a methodology that incorporates real-time measurement of conductor temperatures and ground clearances using a transmission line monitor, coupled with information technology and data analytics, to allow utility operators to manage their transmission systems using a dynamic line rating process. Dynamic line ratings may incorporate real-time or near-real-time data of transmission line conditions in lieu of conservative assumptions, in order to more accurately assess actual transmission line performance such that more of the power conveying capacity of the existing transmission infrastructure can be accessed with continued compliance with safety requirements applicable to the transmission line system.

20 Claims, 5 Drawing Sheets

Exemplary temperature-current relationships plotted using the IEEE 738 equation and the Dynamic Line Rating calculation process.

(56) References Cited

U.S. PATENT DOCUMENTS

| | | | |
|---|---|---|---|
| 5,235,861 A | 8/1993 | Seppa | |
| 5,517,864 A | 5/1996 | Seppa | |
| 5,892,430 A | 4/1999 | Wiesman et al. | |
| 5,918,288 A | 6/1999 | Seppa | |
| 5,933,355 A | 8/1999 | Deb | |
| 6,097,298 A | 8/2000 | Brown | |
| 6,195,243 B1 | 2/2001 | Spencer et al. | |
| 6,205,867 B1 | 3/2001 | Hayes et al. | |
| 6,229,451 B1 | 5/2001 | Brown | |
| 6,304,838 B1 | 10/2001 | Brown | |
| 6,523,424 B1 | 2/2003 | Hayes et al. | |
| 6,853,327 B2 | 2/2005 | Miceli et al. | |
| 7,298,957 B2 | 11/2007 | Browning | |
| 7,369,045 B2 | 5/2008 | Hansen | |
| 7,494,271 B2 | 2/2009 | Scholtz et al. | |
| 7,504,819 B2 | 3/2009 | Engelhardt | |
| 7,620,517 B2 | 11/2009 | Scholtz et al. | |
| 7,641,387 B2 | 1/2010 | Engelhardt et al. | |
| 7,706,927 B2 | 4/2010 | Naumann et al. | |
| 7,786,894 B2 | 8/2010 | Polk et al. | |
| 8,170,817 B2 | 5/2012 | Strehl | |
| 8,275,570 B2 | 9/2012 | Rousselle | |
| 8,374,821 B2 | 2/2013 | Rousselle et al. | |
| 8,386,198 B2 | 2/2013 | Lancaster | |
| 2005/0222808 A1 | 10/2005 | Zima et al. | |
| 2007/0038396 A1 | 2/2007 | Zima et al. | |
| 2007/0200556 A1 | 8/2007 | Engelhardt | |
| 2008/0077336 A1 | 3/2008 | Fernandes | |
| 2008/0204054 A1 | 8/2008 | Wells | |
| 2009/0138229 A1* | 5/2009 | Engelhardt | G01C 9/00 702/130 |
| 2009/0216472 A1 | 8/2009 | Zima et al. | |
| 2009/0243876 A1 | 10/2009 | Lilien et al. | |
| 2010/0033345 A1 | 2/2010 | Polk et al. | |
| 2011/0137483 A1* | 6/2011 | Jenkins | H02J 3/00 700/293 |
| 2011/0218790 A1 | 9/2011 | Algaonkar et al. | |
| 2012/0173146 A1 | 7/2012 | Mohr et al. | |

OTHER PUBLICATIONS

Bliss, Ryan, Smartline Ratings, Dynamic Grid Management Solution for Transmission Asset Optimization. MWH, Building a Better World, Apr. 29, 2012.

Bliss, Ryan, The Key to Dynamic Line Ratings in Understanding Conductor Behavior. CIGRE US National Committee, 2013 Grid of the Future Symposium.

Bliss, Ryan, Transmission Line Capacity Optimization by Real Time Monitoring of Conductor Behavior. 2013 Grid of the Future Symposium.

Spillane, Phil. News Release dated Sep. 6, 2012. Lindsey Manufacturing Co. http://www.lindsey-usa.com/newsRelease.php.

Gentle, Jake et al. Concurrent Wind Cooling in Power Transmission Lines. Idaho National Library, Aug. 2012, 2012 Western Energy Policy Research Conference.

Goodwin, Tip and Cale Smith, Smart Grid Demonstration Project—Dynamic Line Rating (DLR)—Oncor Electric Delivery. 2011 ERCOT Regions and Training Seminar.

Goodwin, Tip. Smart Grid Demonstration Project—Dynamic Line Rating (DLR). Oncor Electric Delivery, Mar. 13, 2012.

Guide for Application of Direct Real-Time Monitoring Systems, Working Group B2.36, © 2012.

Stricker, Nicole "Transmission Line Security Monitor". Idaho National Library, Jun. 9, 2008.

Svoboda, John "Transmission Line Security Monitor: Final Report" Apr. 2011, Idaho National Laboratory.

U.S. Appl. No. 61/734,191, filed Dec. 6, 2012, entitled "Systems and Methods for Calculating Power Transmission Line Capacity".

U.S. Appl. No. 12/572,141, Office Action dated Jan. 30, 2013.

Clairmont, B. "Dynamic Rating Concepts for Overhead Lines" Technical Progress, EPRI, Dec. 2000.

* cited by examiner

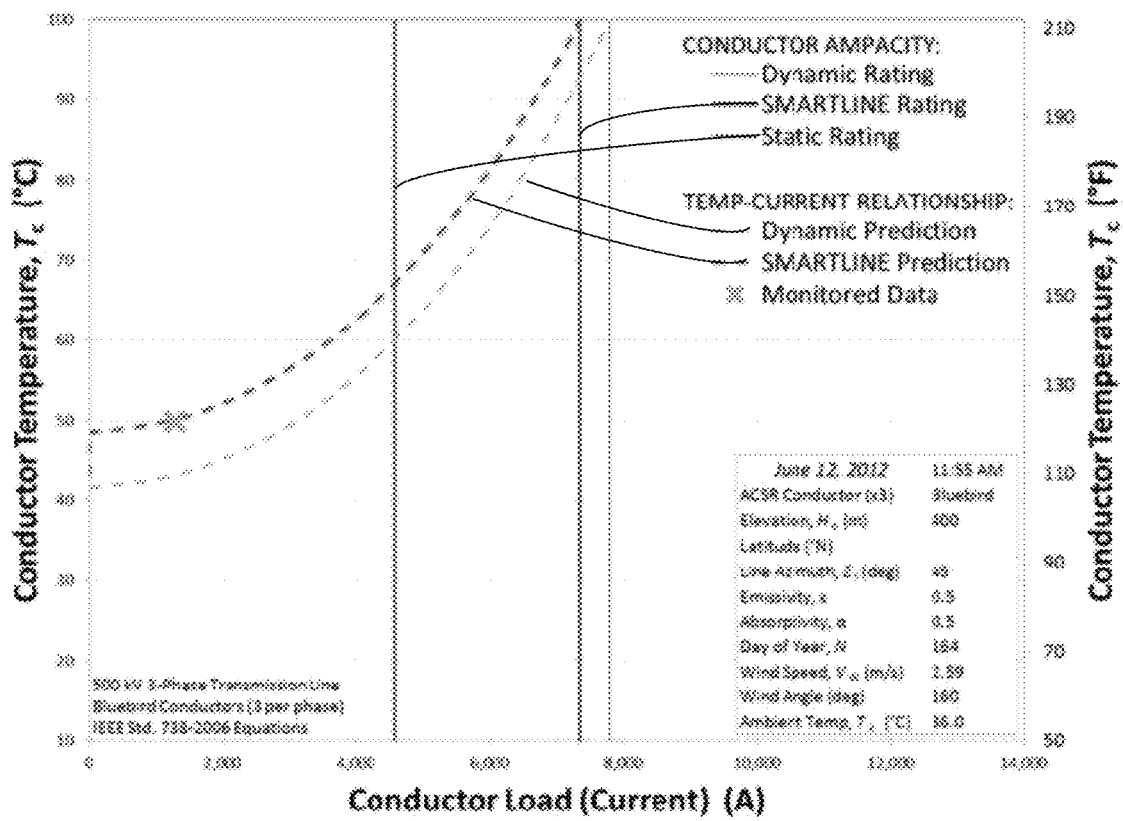
Figure 1. Exemplary temperature-current relationships plotted using the IEEE 738 equation and the Dynamic Line Rating calculation process.

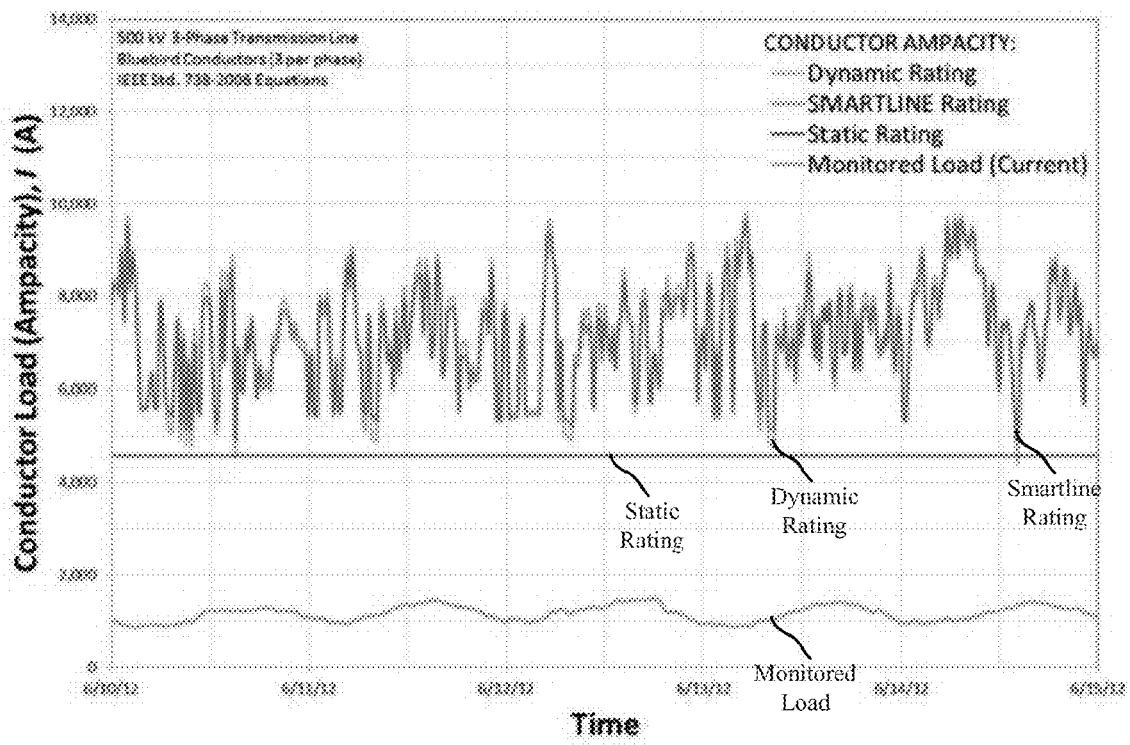
Figure 2. Plots of ampacity over time calculated using the IEEE 738 equation (Dynamic Rating) and as adjusted using the disclosed dynamic rating methodology Rating process that shows the reduced peaks because the IEEE 738 equation over-estimates cooling of high winds, and under-estimates cooling of low speed winds.

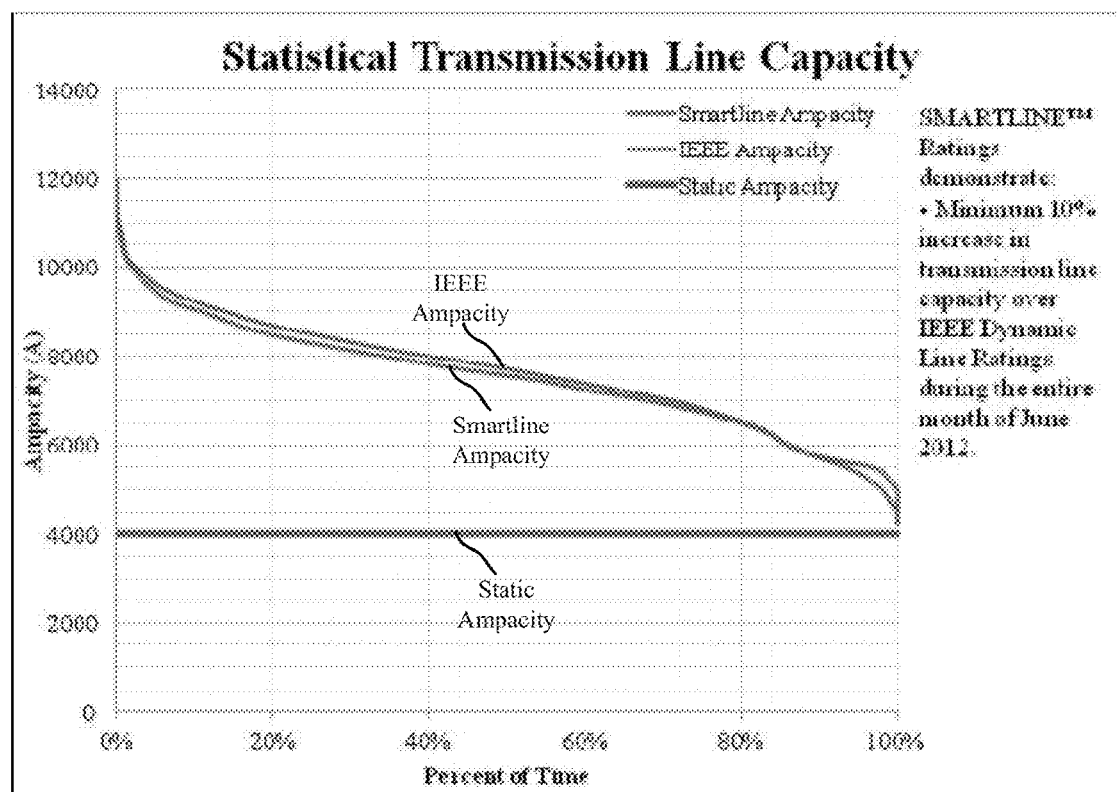
Figure 3. Statistical plot of dynamic line ratings calculated for exemplary data showing the comparative differences between dynamic line ratings calculated using the IEEE 738 equation and the dynamic rating methodology of the present disclosure.

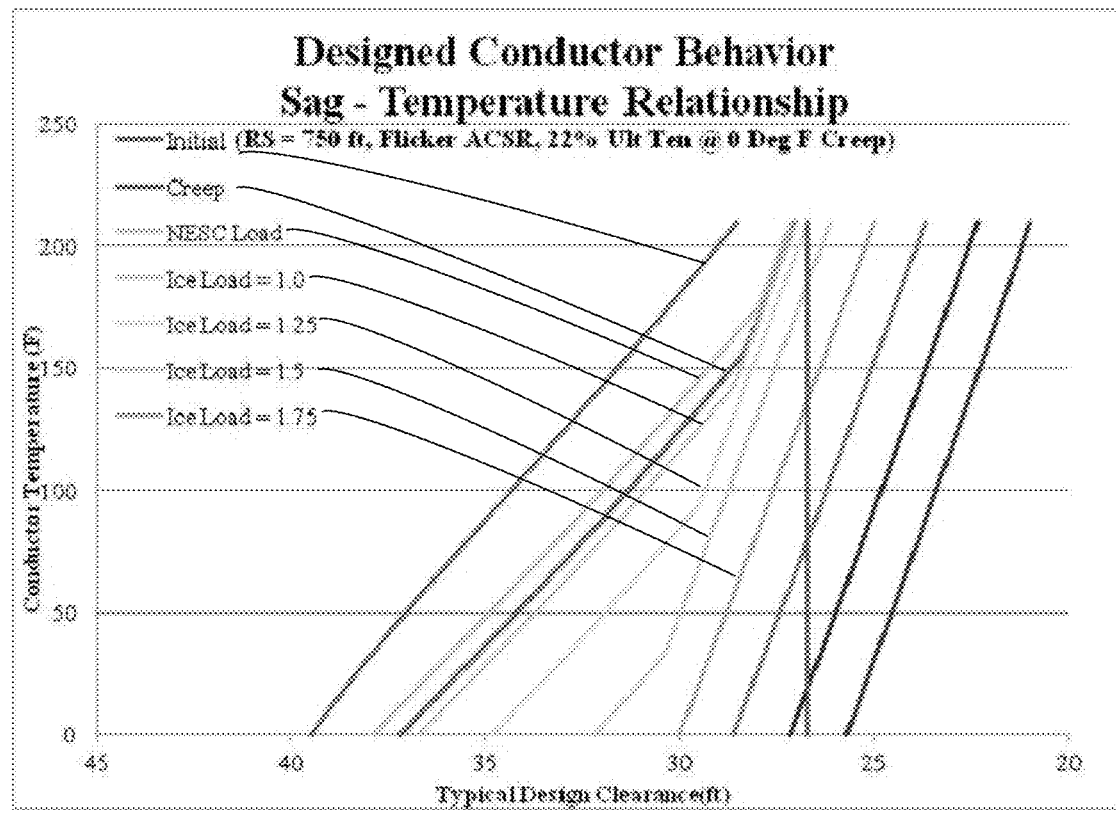

Figure 4. Approximate linear relationship between conductor temperature and design clearance for different conductors and load conditions. Note that some conductors that are constructed of two different materials (e.g., aluminum clad, steel reinforced) have two characteristic linear relationships and a "knee point" at which one of the materials no longer provides resistance given the different characteristic properties of the two materials.

SYSTEMS AND METHODS FOR CALCULATING POWER TRANSMISSION LINE CAPACITY

RELATED APPLICATIONS

This application claims the benefit of U.S. Provisional Application No. 61/734,191, filed Dec. 6, 2012, entitled "SYSTEMS AND METHODS FOR CALCULATING POWER TRANSMISSION LINE CAPACITY," which is hereby incorporated by reference into this application.

BACKGROUND

As is well known, utility power is produced by a number of different power generators and delivered to end customers through a system of power transmission and distribution lines. Power transmission lines are generally high voltage lines used to transmit power from power generators to locations (e.g. power substations) where the power may be distributed through lower voltage power distribution lines to end customers. Transmission line power throughput is typically constrained by heating of the line which results in thermal expansion of the conductor, lengthening it, and manifesting itself as increased sag in the line. Regulations require transmission system operators to control the amount of power throughput (i.e., ampacity) in the lines such that the lines do not heat to the point that thermal expansion results in line sag where clearance with underlying features is reduced to the point that an unsafe condition occurs (e.g., line contacting underlying vegetation or structures). For safe operation, minimum clearances for transmission lines are specified, and the amount of power that can be transmitted through a line is regulated conservatively by the specification of a line rating. Line ratings are traditionally established for each line with conservative assumptions about ambient temperature (e.g., assumed to be relatively hot), wind speed (e.g., little wind for convective cooling of the line), and cloud cover (e.g., no cloud cover to mitigate direct sunlight from heating the lines). Ambient conditions can have a large influence on how much power can be transmitted through a power line while complying with clearance requirements.

Power utilities have historically used static line ratings to manage the capacity of their transmission lines to transmit power. Static line ratings are traditionally designed to be conservative, and generally reserve 30 percent or more of a lines capacity as buffer to avoid problems associated with line sag and clearance issues that can occur when certain environmental and load conditions are met.

Institute of Electrical and Electronics Engineers (IEEE) Standard 738 provides a mathematical equation used to estimate the relationship of conductor temperature (i.e., transmission line temperature) and current (i.e., electric load) with consideration of different weather conditions (variables to include ambient temperature, wind direction and magnitude, solar radiation influx). The primary use of the IEEE Standard 738 mathematical model is to establish a static line rating for the purpose of regulating the safe operation of power transmission lines.

As mentioned above, transmission line throughput is typically constrained by heating of the line. There are two primary criteria governing the safe functioning and operation of a power line: 1) the temperature of the conductor material must be maintained below a threshold such that the mechanical strength of the conductor itself is not compromised (i.e., mechanical properties of line do not deteriorate); 2) the load on the line must be maintained below a threshold such that as the temperature of the line increases with the load, and the line expands thermally, and thus lengthens, the sag of the line does not violate the minimum safe operating clearance with the ground. The first criterion is established by the known mechanical properties of the conductor material as determined through controlled laboratory studies, and is characteristic of a given type of conductor. The second criterion is satisfied by operating the line such that the static line rating as calculated using the IEEE Standard 738 equation is not exceeded.

The temperature of a power line is dynamic, and is affected by a number of variables to include the load on the line (i.e., electrical current transmitted through the line), convective cooling from the wind, conductive cooling/heating from ambient air temperatures, radiation cooling, and heating from incident solar radiation. The IEEE Standard 738 analytical model is a heat balance model that combines theory with empirical data to approximate the relationship of conductor temperature relative to load for a variety of environmental conditions. In practice, it is used to calculate the maximum permissible power load for a subject line (i.e., the line ampacity) using a maximum permitted conductor temperature (characteristic of the conductor material to avoid loss of strength, often set at 100° C. for aluminum clad steel reinforced conductor, for example) and a set of conservative (i.e, not conducive to line cooling) weather conditions (e.g., little wind, high ambient temperature, high incident solar radiation). The maximum power load calculated using the IEEE Standard 738 mathematical equation for the conditions described above is termed the static line rating, and when established for all the lines within a transmission system, is used by transmission operators to govern the safe operation of the grid. In other words, if a transmission system is operated such that none of the lines exceed their associated static line ratings, the operator is assured that the temperature of the conductors will not exceed a threshold that compromises their mechanical strength properties, and the sag of the line will not increase to the point that minimum ground clearances are violated.

The Power Delivery Industry has known for many years that using static line ratings to govern operation of the grid, while safe, may be overly conservative in many instances. Studies have demonstrated that environmental factors significantly affect thermal expansion and contraction of a line, and thus its sag. Windy days cool lines through thermal convection, while cold days cool lines through thermal conduction. Sunny days heat lines through solar radiation. Static line ratings are developed with the conservative assumption that the ambient environmental conditions are exceptionally unfavorable to line cooling (i.e., relatively hot, sunny days, with little wind), despite the fact that this is most often not the case.

SUMMARY

The present disclosure provides a methodology that incorporates real-time measurement of conductor temperatures and ground clearances using a transmission line monitor, coupled with information technology and data analytics, to allow utility operators to manage their transmission systems using a dynamic line rating process. Dynamic line ratings may incorporate real-time or near-real-time data of transmission line conditions in lieu of conservative assumptions, in order to more accurately assess actual transmission line performance such that more of the power conveying capacity of the existing transmission infrastructure can be accessed with continued compliance with safety requirements applicable to the transmission line system.

In some embodiments, a system may be provided that bundles an asset management software tool along with instrumentation that may provide real-time or near-real-time information related to the temperature of the conductor of a transmission line along with other information, such as clearance of the power transmission line and other ambient environmental conditions. Such a system may provide a dynamic line rating for associated transmission lines with real-time or near-real-time monitoring that allows power utilities to more fully utilize their installed capacity by allowing them to access the capacity normally reserved as buffer, while actively managing the risks associated with line sag and clearance issues. In some embodiments, such systems may provide enhancements or increased abilities for a number of areas, such as, for example, enhanced access to existing line capacity normally reserved as buffer to mitigate against line sag risks; monetization of surplus static line capacity by the ability to forecast weather/line conditions 24 hours in advance, thus, permitting the sale of dynamic line capacity into the power delivery market; improved avoidance of regulatory penalties associated with violation of line clearance requirements by improved and actively managed line sag/clearance risks; deferral of capital expenditures associated with the provision of new transmission line capacity by optimizing the use of the existing line capacity; immediately improved ability to integrate variable power generation sources (e.g., wind and solar) into the grid with the increased available transmission capacity; and improved flexibility in scheduling and managing line outage/maintenance programs by accessing existing line capacity not currently available.

BRIEF DESCRIPTION OF THE DRAWINGS

A further understanding of the nature and advantages of the present disclosure may be realized by reference to the following drawings. In the appended figures, similar components or features may have the same reference label.

FIG. 1 shows a graph of conductor load versus conductor temperature, in accordance with various aspects of the present disclosure;

FIG. 2 shows a graph of conductor load versus time in accordance with various aspects of the present disclosure;

FIG. 3 shows a graph of statistical transmission line capacity, in accordance with various aspects of the present disclosure;

FIG. 4 shows a graph of conductor temperature and design clearance, in accordance with various aspects of the present disclosure.

DETAILED DESCRIPTION

Figure 5:
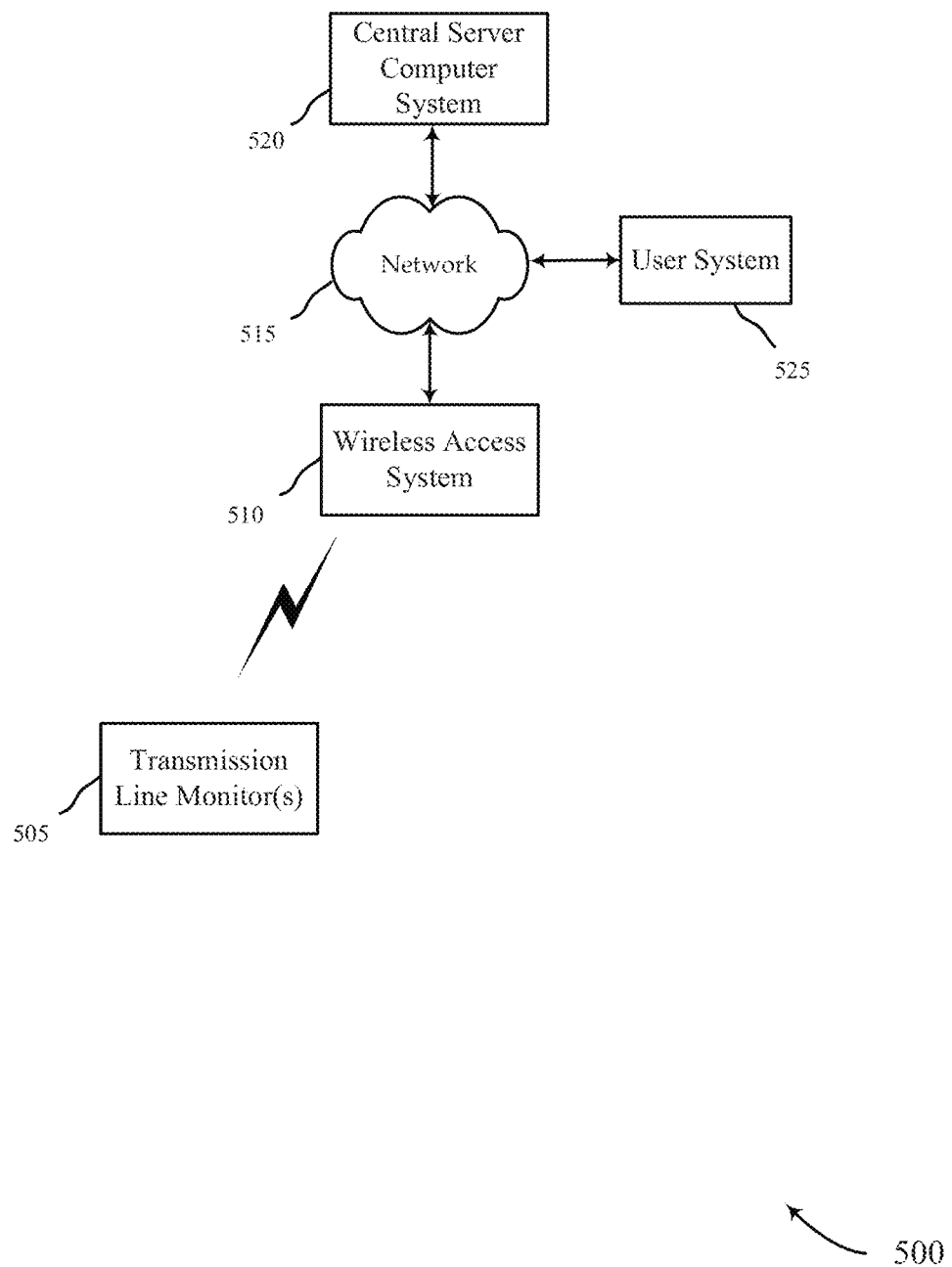
FIG. 5 shows a block diagram of a system for dynamic power line rating, in accordance with various aspects of the present disclosure.

The present disclosure recognizes that the incorporation of real-time or near-real-time measurement of transmission line conductor temperatures and ground clearances using a transmission line monitor, coupled with information technology and data analytics, may be utilized to allow utility operators to manage their transmission systems using a dynamic line rating process. Various studies have suggested that if ambient conditions could be factored into a real-time line rating that perhaps 30-100 percent more power could be routinely transmitted safely through the existing transmission infrastructure than is generally permitted by the conservatively established static line ratings used today. The present disclosure provides systems and methods that allow transmission system operators a reliable way to factor ambient conditions into their operation of the power transmission system so that they may optimize the amount of power throughput in the system at any given time with real-time or near-real-time knowledge that they are complying with all regulatory requirements. Further, in some embodiments, the present disclosure provides system and methods that may allow transmission system operators to forecast with confidence the actual capacity of the transmission system for some future period, such as 24-48 hours, for the purpose of selling this capacity into the power delivery market.

These, and other, benefits are provided in various embodiments through dynamic line ratings for power transmission lines that may be monitored by the system. According to various embodiments, power line monitoring devices are placed at strategic locations on a power transmission line. The locations of the power line monitoring devices may be, for example, at locations that are known to have relatively low clearances as compared with other locations on the power transmission line. Information from the power line monitoring devices may be used to obtain a direct measurement that may be used to determine line sag or clearance. In some embodiments, the power line monitoring devices generate internal power from the conductor to which it is attached to operate a laser to accurately measure the clearance of the line above an underlying feature to provide an accurate measurement of line clearance. This information, coupled with other data that may be provided by the power line monitoring devices or other sources, such as ambient temperature, wind direction, and wind speed, may be used to correlate environmental conditions with line clearances. This correlation may be used to provide a forecast of available capacity based on expected environmental conditions for some period into the future. In some embodiments, a system collects, stores, and evaluates historical data and current information for the purpose of forecasting the ampacity of the transmission infrastructure for the next day, for example. Being able to forecast the ampacity of the transmission infrastructure 24-hours (or other time period) in advance allows utility system operators to monetize the difference between a traditional static line rating and a dynamic line rating by selling this capacity into the power delivery market.

The system of some embodiments uses a dynamic rating methodology. The dynamic rating methodology uses conductor temperature measurement data to calibrate or adjust the approximate heat balance equation results of the IEEE 738 publication to more accurately represent the actual load-temperature relationship of a transmission line. The adjusted load-carrying capacity or ampacity more accurately represents a real-time dynamic load rating, as indicated by actual field data, than that provided by IEEE 738. The calculation methodology is as follows:

Terms Defined:

$T_{c,IEEE\ 738}(t)$=Conductor temperature calculated using IEEE 738 for an actual measured load and a measured set of environmental variables.

$T_{c,monitored}(t)$=Actual conductor temperature measured using Lindsey TLM™ corresponding with the actual measured load used in the calculation of $T_{c,IEEE\ 738}(t)$.

$T_{c,delta}(t)$=Temperature difference between that estimated by the IEEE 738 equation and that actually measured using the Lindsey TLM™.

$T_{MOT}$=Maximum operating temperature used for a specific conductor in the IEEE738 equation. This temperature is protective of the conductor material.

$T_{MOT,corr}(t)$=Maximum operating temperature from the IEEE 738 equation adjusted using the $T_{c,delta}(t)$ correction factor for temperature.

$I_{IEEE\ 738}(t)$=Ampacity calculated using IEEE 738 and $T_{MOT}$ for the subject conductor.

$I_{IEEE\ 738@TMOT,corr}(t)$=Ampacity calculated using IEEE 738 and $T_{MOT,corr}(t)$.

$I_{Delta}(t)$ Ampacity adjustment factor calculated as the difference between the ampacities calculated using IEEE 738 using $T_{MOT}$ and $T_{MOT,corr}(t)$.

$I_{SMARTLINE}(t)$=Calculated ampacity calculated as the IEEE 738 ampacity plus the ampacity adjustment factor ($I_{Delta}(t)$).

Dynamic Rating Methodology Calculations:

$$T_{c,delta}(t)=T_{c,IEEE\ 738}(t)-T_{c,monitored}(t)$$

$$T_{MOT,corr}(t)=T_{MOT}-T_{c,delta}(t)$$

$$I_{Delta}(t)=I_{IEEE\ 738}(t)-I_{IEEE\ 738@TMOT,corr}(t)$$

$$I_{SMARTLINE}(t)=T_{c,IEEE\ 738}(t)+I_{Delta}(t)$$

Plots of the temperature-current relationship developed using both the IEEE 738 equation and as adjusted with actual conductor temperature data using the dynamic rating methodology calculation process are illustrated in FIG. 1 for a specific set of environmental conditions. Note that in this case the dynamic line rating calculated using the IEEE 738 equation is marginally higher than that calculated using the dynamic rating methodology process.

In one evaluation of field-observed data collected in June 2012 from a transmission line, it was observed that the IEEE 738 equation generally over-estimates the convective cooling that occurs with relatively high winds (>2.5 meters per second), and under-estimates the convective cooling that occurs with low wind speeds (<0.25 meters per second). The result is that dynamic ratings calculated using IEEE 738 will yield values that are too high for high wind speeds, and too low for low wind speeds. When adjusted using real-time temperature data and the dynamic rating methodology of the present disclosure the resulting ratings are comparatively attenuated for high and low wind speeds as shown in FIG. 2.

When ratings using the dynamic rating methodology of the present disclosure are compared with dynamic ratings calculated using IEEE 738 for the exemplary data and compared statistically relative to the percent of the time that they occur, plots as shown in FIG. 3 are produced. Note that a portion of the time the dynamic ratings derived using IEEE 738 are higher than for the dynamic rating methodology of the present disclosure (relatively high winds), and a portion of the time they are lower (relatively low winds).

In summary, the dynamic rating methodology of the present disclosure uses real-time (or near-real-time) temperature data to adjust the relationship between conductor temperature and current estimated by the IEEE 738 equation closer to reality so that a relatively accurate dynamic line rating can be calculated for use in real-time, dynamic management of transmission systems by utility operators.

The dynamic rating process as described above uses, according to some embodiments, point measurements of actual conductor temperature to adjust the current (i.e., load) estimated by the IEEE 738 equations to more accurately represent real operating conditions. In one embodiment, power line monitors are used to provide this data, such as a Lindsey TLM power line monitor provided by Lindsay Manufacturing Company of Azusa, Calif.

It is known that the relationship between conductor temperature and line sag/clearance is approximately linear, as illustrated in FIG. 4. If the line clearance for a particular location is known, along with the equation describing the linear relationship between conductor temperature and clearance, then a representative or effective temperature for the entire line may be calculated. This approach would eliminate concerns that a measured conductor temperature at a single location may not be representative of the overall mean conductor temperature because the sag/clearance measurement would effectively integrate the conductor temperature for the entire line.

In some embodiments, the power line monitors, in addition to measuring conductor temperature, measures line clearance directly using a LiDAR sensor. Over time it is possible to collect sufficient conductor temperature and clearance data to mathematically determine the linear relationship between conductor temperature and clearance for a specific line using simple linear regression techniques. With a well-established linear relationship (e.g., coefficient of determinations above 0.9) between conductor temperature and clearance it is possible to use a clearance measurement from the power line monitors to calculate a representative or effective conductor temperature for a subject line, thus avoiding concerns that a spot temperature measurement is not sufficiently representative of a line overall.

In some embodiments, a relationship is established between conductor temperature $T_{c,eff}$ and line clearance $Y_{monitored}$ for the subject conductor that is of the form $$T_{c,eff}=mY_{monitored}+b$$

Where:

$T_{c,eff}$=Effective or representative temperature of the subject conductor.

m=Slope of the line from a plot of monitored conductor temperatures ($T_{monitored}$) versus monitored line clearance measurements ($Y_{monitored}$) or as determined from a least squares, best-fit linear regression analysis (preferred method).

b=y-intercept value as determined from a plot of monitored conductor temperatures ($T_{monitored}$) versus monitored line clearance measurements ($Y_{monitored}$) or as determined from a least squares, best-fit linear regression analysis (preferred method).

In some embodiments, a least squares, best-fit linear regression analysis is performed of the pairs of measurements of $Tc,_{monitored}$ versus $Y_{monitored}$ to evaluate the relationship between the two variables. With this mathematical relationship determined with a coefficient of determination that is acceptable (e.g., $r^2>0.90$), the representative or effective temperature ($T_{c,eff}$) can be determined for a measured line clearance value ($Y_{monitored}$) from a power line monitor by plugging in the clearance measurement into the equation. Once the effective temperature is determined in this manner, line capacity calculations proceed as follows:

$$T_{c,deltadirect}=T_{c,IEEE\ 738}(t)-T_{c,eff}$$

$$T_{MOT,corrdirect}(t)=T_{MOT}-T_{c,deltadirect}(t)$$

$$I_{Deltadirect}(t)=I_{IEEE\ 738}(t)-I_{IEEE\ 738@TMOT,corrdirect}(t)$$

$$I_{SMARTLINEDIRECT}(t)=I_{IEEE\ 738}(t)+I_{Deltadirect}(t)$$

Thus, this rating process differs from the above-described rating process in that it incorporates actual line clearance measurements from a transmission line monitor along with the linear or piecewise linear relationship between conductor temperature and line clearance for a subject conductor to calculate the dynamic ampacity for a line. The linear relationship for a specific conductor may be determined by using least squares regression analysis of actual conductor temperature ($T_{c,monitored}$) and line clearance ($Y_{monitored}$) measurement data pairs collected using a transmission line monitor over a range of environmental and operating conditions. Once the linear relationship between temperature and clearance is established, an effective temperature ($T_{c,eff}$) may be determined for a measured value of line clearance ($Y_{monitored}$). The benefit of using an effective temperature ($T_{c,eff}$) in these ratings is that it eliminates the potential concern that localized measurements of temperature may not be representative of overall mean conductor temperature.

FIG. 5 illustrates an exemplary system in which various of the embodiments of the disclosure may be implemented. In FIG. 5, transmission line monitor(s) 505 are wireless monitors that are placed on transmission line(s) in a power transmission system. The transmission line monitor(s) connect to a wireless access system 510 through a wireless connection, such as a cellular or other radio connection, for example. Such a wireless network may include any suitable wireless network capable of transmitting data on any of a number of different wireless protocols. Such networks are well known and need not be described in further detail here. The wireless access system 510 is interconnected to a network 515 such as, for example, the Internet, which has other network attached components. A central server computer system 520 is connected to the network 515 and, in various embodiments, performs functions related to transmission line rating and capacities. The central server computer system 520 may, for example, be made up one or more server computers, personal computers, workstations, web servers, or other suitable computing devices, and the individual computing device(s) for a given server may be local or remote from each other. In various embodiments, the central server computer system 520 receives transmission line information, weather forecast information, and forecast transmission line usage information to forecast available transmission line capacity, similarly as described above. A user system 525 is also connected to the network 515. Such a user system 525 may be a point of user access to information provided by the central server computer system 520. Of course, the information calculated by the central server computer system 520 may be provided to any number of other systems or users through any suitable access technology. In some embodiments, the central server computer system 520 is configured to receive forecast requests from a user system 525 and provide the forecasted available capacity for one or more transmission lines.

It should be noted that the systems and devices discussed above are intended merely to be examples. It must be stressed that various embodiments may omit, substitute, or add various procedures or components as appropriate. For instance, it should be appreciated that, in alternative embodiments, features described with respect to certain embodiments may be combined in various other embodiments. Different aspects and elements of the embodiments may be combined in a similar manner. Also, it should be emphasized that technology evolves and, thus, many of the elements are exemplary in nature and should not be interpreted to limit the scope of the invention.

Specific details are given in the description to provide a thorough understanding of the embodiments. However, it will be understood by one of ordinary skill in the art that the embodiments may be practiced without these specific details. For example, well-known circuits, structures, and techniques have been shown without unnecessary detail in order to avoid obscuring the embodiments.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. An apparatus for determining a current rating for an electrical transmission line, comprising:
   at least one ground clearance monitor located on a power transmission line;
   at least one line temperature monitor located on the power transmission line;
   a central server computer system comprising:
      a receiver configured to receive actual line clearance measurements and actual line temperature measurements from the monitors located on the power transmission line; and
      a processor coupled with the receiver and configured to calculate a dynamic ampacity for the transmission line based at least in part on the line clearance, line temperature, and conductor characteristics of one or more conductors of the transmission line; and
   a user system capable of displaying the dynamic ampacity for the transmission line resulting in an adjusted load-temperature relationship for the power transmission line.

2. The apparatus of claim 1, wherein the dynamic ampacity for the transmission line is calculated using a least squares regression analysis of actual conductor temperature and line clearance measurement data pairs.

3. The apparatus of claim 2, wherein the actual conductor temperature and line clearance measurement data pairs are received from a transmission line monitor located on the transmission line.

4. The apparatus of claim 2, wherein the processor is further configured to calculate a relationship between actual conductor temperature and line clearance.

5. The apparatus of claim 4, wherein the processor is further configured to calculate an effective temperature for a measured value of line clearance, and wherein the dynamic ampacity for the transmission line is based at least in part of the calculated effective temperature.

6. The apparatus of claim 1, wherein said at least one ground clearance monitor comprises a LIDAR.

7. The apparatus of claim 1, wherein the receiver is configured to periodically receive line clearance measurements and line temperature measurements from a plurality of transmission line monitors.

8. The apparatus of claim 7, wherein the processor is further configured to periodically update the dynamic ampacity based on the received measurements.

9. The apparatus of claim 1, wherein the processor is further configured to calculate an amount of additional capacity available for the transmission line.

10. The apparatus of claim 9, wherein the processor is further configured to forecast an available ampacity for the transmission line for a future time period based on an expected temperature of the transmission line at the future time period.

11. A method for determining a current rating for an electrical transmission line, comprising:
providing at least one ground clearance monitor and at least one line temperature monitor on said power transmission line;
providing a central server computer system comprising:
receiving line clearance measurements and line temperature measurements for a transmission line; and
calculating a dynamic ampacity for the transmission line based at least in part on the line clearance, line temperature, and conductor characteristics of one or more conductors of the transmission line; and
providing said calculated dynamic ampacity for the transmission line on a user system display;
adjusting a load-temperature relationship from said power transmission line; and
managing power transmission of said power transmission line.

12. The method of claim 11, wherein the dynamic ampacity for the transmission line is calculated using a least squares regression analysis of actual conductor temperature and line clearance measurement data pairs.

13. The method of claim 12, wherein the actual conductor temperature and line clearance measurement data pairs are received from a transmission line monitor located on the transmission line.

14. The method of claim 12, further comprising calculating a relationship between actual conductor temperature and line clearance.

15. The method of claim 14, further comprising calculating an effective temperature for a measured value of line clearance, and wherein the dynamic ampacity for the transmission line is based at least in part of the calculated effective temperature.

16. The method of claim 11, wherein said at least one ground clearance monitor comprises a LIDAR.

17. The method of claim 11, wherein receiving the receive line clearance measurements and line temperature measurements comprises receiving the measurement periodically from a plurality of transmission line monitors.

18. The method of claim 17, further comprising periodically updating the dynamic ampacity based on the received measurements.

19. The method of claim 11, further comprising calculating an amount of additional capacity available for the transmission line.

20. The method of claim 11, further comprising forecasting an available ampacity for the transmission line for a future time period based on an expected temperature of the transmission line at the future time period.

* * * * *